US 6,724,609 B2

(12) United States Patent
Sun et al.

(10) Patent No.: US 6,724,609 B2
(45) Date of Patent: *Apr. 20, 2004

(54) ELECTROSTATIC SENSING CHUCK USING AREA MATCHED ELECTRODES

(75) Inventors: Hoi Cheong Sun, Dayton, NJ (US); Nitin V. Desai, Princeton Junction, NJ (US); William R. Roach, Rocky Hill, NJ (US); David Norman Ludington, Newtown, PA (US); Timothy Allen Pletcher, Eastampton, NJ (US); David Keller, Newtown, PA (US); Frank B. Lang, Princeton, NJ (US); Peter D. Southgate, Monmouth Junction, NJ (US); Joseph T. McGinn, Flemington, NJ (US)

(73) Assignee: Delsys Pharmaceutical Corporation, Monmouth Junction, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/038,931

(22) Filed: Jan. 4, 2002

(65) Prior Publication Data

US 2002/0167780 A1 Nov. 14, 2002

Related U.S. Application Data

(63) Continuation of application No. 09/417,736, filed on Oct. 14, 1999, now Pat. No. 6,370,005.
(60) Provisional application No. 60/130,985, filed on Apr. 26, 1999, and provisional application No. 60/104,234, filed on Oct. 14, 1998.

(51) Int. Cl.$^7$ .............................................. H02H 23/00
(52) U.S. Cl. ...................................... 361/234; 361/233
(58) Field of Search ................................ 361/234, 233

(56) References Cited

U.S. PATENT DOCUMENTS

| 4,852,810 A | 8/1989 | Behr et al. ................... 239/703 |
| 5,669,973 A | 9/1997 | Pletcher ....................... 118/624 |
| 6,370,005 B1 * | 4/2002 | Sun et al. ..................... 361/234 |

FOREIGN PATENT DOCUMENTS

HU            194507 B         10/1987

OTHER PUBLICATIONS

Hungarian Search Report for P 01 04915 dated Jan. 8, 2003.

* cited by examiner

*Primary Examiner*—Stephen W. Jackson
(74) *Attorney, Agent, or Firm*—Dechert LLP (57) ABSTRACT

Provided is an electrostatic sensing chuck for attracting particles to a portion of a particle contact surface near a deposition electrode, the electrostatic sensing chuck comprising a pixel comprising: a deposition electrode (DE) for selectively establishing an attraction field ($E_a$) at the particle contact surface; a shield electrode (SE) oppositely biased with respect to the deposition electrode; a charge sensing circuit to measure charge accumulated on each of the deposition electrode and the shield electrode, wherein the charge sensing circuit subtracts a second charge it senses at the shield electrode from a first charge it senses at the deposition electrode, thereby determining accumulated charge at the deposition electrode balanced by accumulated charge at the shield electrode.

21 Claims, 2 Drawing Sheets

ELECTROSTATIC SENSING CHUCK USING AREA MATCHED ELECTRODES

This application is a continuation of U.S. application Ser. No. 09/417,736, filed Oct. 14, 1999, now U.S. Pat. No. 6,370,005, and claims the priority of U.S. Provisional Application No. 60/130,985, filed Apr. 26, 1999, and No. 60/104,234, filed Oct. 14, 1998.

The present invention is directed to devices for electrically picking up and dispensing electrically charged powders or beads in a spatially resolved manner. Specifically, this disclosure describes novel electrode configurations and control circuits, and operation and fabrication techniques for electrostatic chucks that pick up, manipulate, transport, and then discharge or place, particles, beads, powders, or objects for use in creating pharmaceutical or chemical compositions, or in performing assays or chemical analysis. The invention solves certain problems associated with sensing chucks that perform powder deposition sensing, by providing a way to cancel error-producing effects when trying to measure accumulated charge with ionic or high polarizability materials in the vicinity of chuck sensing electrodes. Although emphasis is placed on charge sensing chucks that are tailored for powder deposition sensing and calibration, the techniques given may be applied to improve all electrostatic chucks that perform manipulations and/or provide electric fields to aid in moving, switching, shifting or manipulating beads from an originating electrode or source location to a target electrode or location.

Electrostatic chucks can be used to pick up, manipulate, transport, and then discharge or place powders, beads or objects for use in creating pharmaceutical or chemical compositions, or in performing assays or chemical analysis.

Electrostatic chucks operate by acting as clamps to hold or retain an object or objects, and can provide superior performance for manipulating particles or synthetic beads having typical diameters of 100–300 microns in chemical synthesis, such as combinatorial chemistry for solid phase synthesis, or in an assay using PCR (polymerase chain reaction) or other processes. In combinatorial chemistry, a multi-well array such as a microtiter plate allows screening or synthesis of many compounds simultaneously.

For example, electrostatic chucks allow deposition of beads on an array in a manner that is faster and more reliable than by the use of micropipettes. Another application for electrostatic chucks is synthesis of pharmaceutical compositions, especially when used to combine compounds to form compositions to be packaged into administration forms for humans or animals.

Aggregated particles containing one or more active ingredients can be deposited onto well known carriers or substrates to make pharmaceutical dosage forms. Such particles can take the form, for example, of [1] a powders or aerosols, such as dry micronized forms made by air jet milling processes, where overall particle dimensions can be, for example, in the 1 to 10 micron range useful for dry powder respiratory administration of medicaments, with 4–8 microns preferred; [2] beads or microspheres; [3] extremely small structures, including fullerenes, chelates, or nanotubes; or [4] liposomes and fatty droplets formed from lipids or cell membranes; and the like.

The use of electrostatic chucks provides a customized and precise method for formulating drug compositions. The chuck can be used when merging adjacent substrates carrying active ingredient to form multidosage packs, in which dosage can decrease or increase from one individual unit to the next, as in hormone-based (e.g., birth control) drugs or antibiotic remedies. Using electrostatic chucks with deposition sensing, dosages can be established or determined by the number and/or type of beads or amount of powder or particles dispensed onto each pharmaceutical carrier, or by using separate or external electrical, optical, or mechanical dosage sensing. Using electrostatic chucks to place active ingredients into pharmaceutical compositions can achieve high repeatability and is also advantageous when the active ingredients are not compatible, such as when the active ingredient is poorly soluble with a carrier, or where a formulation or carrier negatively affects the bioavailability of the active ingredient.

Although emphasis is placed in this disclosure on use of electrostatic transporter chucks that apply electric fields for particle retention and/or release, the teachings given here can be applied to chucks that also use other phenomena, such as the use of compressed gas or vacuum, or electrically/chemically switchable adhesives, in controlling particles/or substrates. Electrostatic or quasi-electrostatic holding mechanisms, however, are far more benign to delicate bead or particle structures than traditional mechanical techniques, particularly when manipulating biologically active compounds where crushing, contamination, or oxidative damage is preferably minimized or eliminated.

Typically, particles to be transported or manipulated are tribo-charged through frictional encounters and collisions with tribocharging substances, charged by induction charging, or charged by corona charging.

Some electrostatic chucks offer precision in being able to have one, and only one bead or particle attracted, transported, and discharged per chuck, or for each well, pixel, or individual spatial element of the electrostatic chuck. Often, each pixel can be considered a tiny electrostatic chuck that is selectively and independently controlled, such as planar chucks having individually addressable x and y coordinates. This includes individually addressable pixels for different (multiple) bead or particle types.

Often, instead of depositing particles or beads singly, electrostatic chucks are used to attract and place a plurality of powder particles, containing active ingredient, on a substrate, such an edible substrate used for pharmaceutical dosage forms.

Electrodes used for attracting beads can vary widely in construction and structure. Particle attracting electrodes, can, for example, be directly exposed, or covered by a dielectric, to prevent ionic breakdown (sparking) in air and to make use of the properties of dielectrics to enhance bead charge holding capacity. To control the amount of charged particles that may be attracted, an indirect method can also be used where a particle attraction electrode attracts particles indirectly, using capacitive coupling to a pad or floating electrode. The instant invention may be applied to any number of electrostatic chuck designs, but to illustrate, simple chucks are shown here to attract particles directly by way of one or more directly biased (non-floating) electrodes.

Devices or methods that can be used with various aspects of the present invention include, for example, the methods for use of transporter chucks, acoustic bead dispensers and other particle-manipulating devices set forth in Sun, "Chucks and Methods for Positioning Multiple Objects on a Substrate," U.S. Pat. No. 5,788,814, issued Aug. 4, 1998; Sun et al., "Electrostatic Chucks," U.S. Pat. No. 5,858,099, issued Jan. 12, 1999; Pletcher et al., "Apparatus for Electrostatically Depositing a Medicament Powder Upon Predefined Regions of a Substrate," U.S. Pat. No. 5,714,007, issued Feb. 3, 1998; Sun et al., "Method of making pharmaceutical using electrostatic chuck," U.S. Pat. No. 5,846, 595, issued Dec. 8, 1998; Sun et al., "Acoustic Dispenser," U.S. Pat. No. 5,753,302, filed May 19, 1998; Sun, "Bead Transporter Chucks Using Repulsive Field Guidance," U.S. Pat. No. 6,096,368, issued 1-Aug-2000; Sun, "Bead manipulating Chucks with Bead Size Selector,", U.S. Pat. No. 5,988,432, issued Nov. 23, 1999; Sun, "Focused Acoustic Bead Charger/Dispenser for Bead Manipulating Chucks," U.S. Pat. No. 6,168,666, issued Jan. 2, 2001; Sun et al., "AC Waveforms Biasing For Bead Manipulating Chucks," U.S. Pat. No. 6,149,774, issued Nov. 21, 2000; Sun et al, "Method for Clamping and Electrostatically Coating a Substrate," U.S. Pat. No. 6,399,143; Poliniak et al., "Dry Powder Deposition Apparatus," U.S. Pat. No. 6,063,194, May 16, 2000; and "Pharmaceutical Product," U.S. Pat. No. 6,303,143, issued Oct. 16, 2001. Moreover, Sun et al., "Device For The Dispersal And Charging Of Fluidized Powder," U.S. Pat. No. 6,491,241 describes various apparatuses and methods for charging, sizing and manipulating particles.

This invention addresses electrostatic chuck charge sensing, where because of the sensitive nature of the quantities to be measured, certain problems that arise from effects of ionic species and polarizable materials (e.g., water vapor, dust) in the vicinity of the particle contact surface where particles are to be attracted and retained.

Polarization occurs readily in many materials, arising from different atomic and molecular charge-shifting processes. Permanent dipole moments in molecules result in orientation polarization, which is only lost at high excitation frequencies, where molecules may not have enough time to reorient in response to a fast-changing electric field. Aside from the weak effect of distortion polarization arising from distortion of the positions of atomic nuclei by applied fields, there are also polarization effects arising from distortion of atomic electron distributions in response to electric fields, known as electronic polarization.

It is assumed here for simplification that dielectrics in the vicinity of the particle contact surface of the electrostatic chuck, or dielectrics that are used as part of the chuck structure are so-called Class A dielectrics, having a molecular polarizability which is linear, isotropic, and homogeneous. However, this invention is not limited to the examples given here, and may be practiced using chucks employing other than Class A dielectrics, where the molecular polarizability $\alpha$ is a tensor, and possibly a function of position inside the dielectric as well. Moreover, the invention is not limited by the various elements of theory recited here and elsewhere in this disclosure. The invention relates to the observation that a drift-resistant detection or sensing circuit (or multiple detection circuits) can be incorporated into an electrostatic chuck by using capacitance-based sensing of accumulated charge with respect to both a charged particle-attracting electrode, and an oppositely biased shield electrode that is appropriately configured and biased to yield the drift reduction. Applicants have set out their an estimation of the associated parameters and theory, but the invention exists and can be practiced based on appropriate empirical controls irrespective of such associated parameters and theory.

In Class A dielectrics, the vector electric polarization P resulting from a local electric field E is linear, where $$P = \alpha E \tag{1}$$

and $\alpha$ is a simple function of the applicable dielectric constant:

$$\alpha = \epsilon_0(K-1)E \tag{2}$$

where $\epsilon_0$ is the vacuum permittivity and K is the dielectric constant.

Electrostatic chuck designs and operation techniques using attraction electrodes or particle deposition electrodes to pick up and discharge particles can, under certain conditions, encounter voltage drift and measurement error when attempting to sense accumulated charge over the particle deposition electrode because the presence of ionic species, polarizable materials, or substrates having changing polarization, because the charge sensed is shifted to a value which is not proportional to or indicative of, the actual accumulated or deposited particles. When using DC (direct current) bias voltages on electrostatic chucks, unwanted charge shifting and migrating can cause measurement error. For example, a negatively biased electrode will attract positive ions from the air, while a positively biased electrode will attract negative ions from the air. At the same time, polarizable materials like water will be attracted separately to both positively biased and negatively biased electrodes, causing an unpredictable change in effective capacitance of the sensing electrode. Those phenomenon introduce voltage drift error when sensing minute amounts of accumulated particle electric charge, and affect uniformity of particle deposition from chuck to chuck, and from batch to batch. Preparation of dosage forms is thus made difficult because of quantity variations in particles deposited containing active ingredient.

It is important to keep in mind that manipulated charged particles in the vicinity of any conductive surface are subject to powerful electrostatic image forces. As a charged particle approaches any metal or conductive surface, such as a deposition electrode inside a powder dispenser or container, an image charge of opposite polarity will accumulate on that conductive surface. This happens when mobile charge carriers in the conductive surface are attracted by, or repelled by, the particle charge. This movement of charge in the conductive surface in response to a charged particle in the vicinity creates a potent image charge-induced holding force, or electrostatic image force. The electrostatic image force tends to make the particles highly attracted to, and usually later, in tight contact with, the conductive surface. It should be noted that dielectric beads and powder particles in stationary tight contact with a conductive surface have a tendency to keep their charge for long periods, often several days. With particles very close to (e.g., contacting) any conductor, the electrostatic image force generated tends to be greater than that due to any applied field originally used to accelerate the particles toward the electrostatic chuck, and can be on the order of hundreds of times the force due to gravity.

Generally, to attract and retain particles, the total electrical force $F_{elec}$ generated by the total electric field vector $E_{total}$ on a particle with mass m and charge q subject to gravitational acceleration g must be equal to or greater, overall, than the force of gravity, $F_{grav}$, for the particle, so that particle may be accelerated toward one or more attraction electrodes:

$$F_{elec} = E_{total} q \sim F_{grav} = m \, g \tag{3}$$

Upon applying a voltage to a deposition electrode (DE), a particle attraction field $E_a$ may be established. This attraction field $E_a$ can cause particles to be accelerated in the direction of, and subsequently retained by the electrode or an associated particle retention zone.

The total electric field vector, $E_{total}$, results from a number of electric field components, by the principle of superposition. Typically, in the particle manipulation theatre, the total electric field at any point, $E_{total}$, is the vector sum of any discrimination field $E_{discrim}$ applied between the electrostatic chuck and a distant mesh or other electrode or surface, such as a powder feed tube; any polarization field $E_P$ resulting from internal charge polarization inside powders or other bodies present in the particle manipulation theatre; any rejection or repulsion fields $E_r$ set up to discourage particle attraction in selected areas, or to repel particles, such as by applying a repulsive bias to one or more electrodes or conductive surfaces; any particle attraction fields $E_a$ set up via an attractive bias applied to one or more powder deposition or attraction electrodes; and all electrostatic image fields $E_{image}$ set up by conductive surfaces on the electrostatic chuck or in the particle manipulation theatre:

$$E_{total} = E_{discrim} + E_P + E_r + E_a + E_{image} \quad (4)$$

Particle motions and interactions, or collisions with obstacles—and each other—inside a dispenser or container tend to randomize their motion, and this influences particle transport properties, as particles are accelerated toward intended electrodes or particle retention zones. However, in spite of this, the pull of a locally generated electrostatic image force, such as that generated by a charged particle in the vicinity of an attraction electrode, remains in force and is hard to defeat.

In the vicinity of the electrostatic chuck, with a charged particle at a distance d from any conductive surface in the chuck, the electrostatic image force, $F_{image}$, due to the image charge can become, as the particle nears the chuck, is far more significant than the force $F_a = E_a q$ generated by the bead attraction field $E_a$:

$$F_{image} \gg F_a \quad (5)$$

Roughly, the dependence of the electrostatic image force at a distance d for a given charge q on a particle, is as follows, using Coulomb's Law for stationary point charges:

$$F_{image} = \frac{q^2}{4\pi\varepsilon_0 d^2 (\pi d_{particle}^3 / 6)\rho g} \quad (6)$$

In the denominator, $\varepsilon_0$ is the vacuum permittivity; $(\pi d_{particle}^3/6)$ is the particle volume; $\rho$ is the particle mass density in kg/m³; and g is the acceleration due to gravity. This form gives the electrostatic image force in units of g. This electrostatic image force can become a potent force at short distances, but in practice the powder attraction field $E_a$ is still needed to bring charged particles within its influence.

A variety of techniques may be used simultaneously to enhance electrostatic chuck effectiveness, and in particular, to enhance the accuracy and reproducibility of particle manipulations from origination to target electrodes or particle retention zones. These include use of periodic air or fluid flow provided acoustically by a conventional speaker. Such a speaker (not shown) can be in fluid communication with some part of the particle manipulation theatre, so that it may direct acoustic energy to unseat particles that are held by electrostatic image forces to dispenser surfaces, or during particle discharge at a desired target (e.g., a dosage form), to unseat beads held by electrostatic image forces to the chuck itself. It should be noted, however, that preferred apparatuses and methods of delivering particle to an electrostatic chuck for deposition include those described in Poliniak et al., "Dry Powder Deposition Apparatus," U.S. Pat. No. 6,063,194 and Sun et al., "Device For The Dispersal And Charging Of Fluidized Powder," U.S. Pat. No. 6,491,241.

However, it is not possible generally to move unwanted ions or polarizable materials such as water vapor and dust away from particle sensing electrodes, and this causes measurement errors in spite of any particle placement accuracy obtained through the use of speakers, fluid flow, and the like.

It is therefore desirable not only to obtain high resolution, directed particle deposition sensing that overcomes the tendency of ionic species and polarizable materials to skew deposition sensing measurements, but also to provide a method that allows automated matrix motion operations that permit accurate, repeatable directed particle deposition sensing, without adversely affecting the attraction of particle to intended particle deposition electrodes and retention zones inside a particle manipulation theatre.

Other objects sought and achieved by the invention will become apparent upon reading of the specification. For example, it is a further object of the invention to employ a driving circuit that automatically subtracts all or most "error" charge induced by such ionic or polarizable materials, while allowing unfettered sensitive particle charge sensing to proceed. This, combined with certain improved chuck fabrication techniques, makes accurate and reproducible particle deposition sensing much easier to achieve.

In attracting and manipulating particles, electrostatic image charges, electric polarization, and particle mass and transport, play a role.

SUMMARY OF THE INVENTION

These problems are addressed by this invention using methods that reduce the error-producing effect of unwanted ionic species and polarizable materials in the vicinity of the particle contact when performing particle deposition sensing by measuring accumulate particle charge near a deposition electrode. This allows easier, more accurate and reproducible particle deposition sensing.

In one embodiment, the invention provides an electrostatic sensing chuck for attracting particles to a portion of a particle contact surface near a deposition electrode, the electrostatic sensing chuck comprising a pixel comprising: a deposition electrode (DE) for selectively establishing an attraction field ($E_a$) at the particle contact surface; a shield electrode (SE) oppositely biased with respect to the deposition electrode; a charge sensing circuit to measure charge accumulated on each of the deposition electrode and the shield electrode, wherein the charge sensing circuit subtracts a second charge it senses at the shield electrode from a first charge it senses at the deposition electrode, thereby determining accumulated charge at the deposition electrode balanced by accumulated charge at the shield electrode (of opposite polarity).

Alternatively expressed, the invention provides an electrostatic sensing chuck is provided for attracting powder near a deposition electrode (DE) on a particle contact surface (PCS) that is in the presence of at least one polarizable material, and for charge sensing the powder when attracted and retained near the deposition electrode. The electrostatic sensing chuck comprises a deposition electrode for selectively establishing an attraction field ($E_a$) at the particle contact surface; a shield electrode (SE) oppositely biased with respect to the deposition electrode, with the shield electrode positioned, sized and oriented with respect to the deposition electrode such that an electric charge distribution created by polarization in any polarizable material near the deposition electrode is matched at least in part by a similarly created electric charge distribution of opposite polarity or direction near the shield electrode. In this way, the sum of the respective charges in the electric charge distribution and in the similarly created electric charge distribution of opposite polarity tends toward zero. The shield electrode does not have to be immediately adjacent the deposition electrode. In another embodiment, the shield electrode can be positioned immediately adjacent the deposition electrode.

The invention includes an embodiment where this matching is accomplished in large part by having the effective surface area of the shield electrode ($A_{SE}$) matched to the effective surface area of the deposition electrode ($A_{DE}$). Preferably under this embodiment, the surface areas are adjusted as needed to achieve cancellation of drift or error. The chuck can further comprise a dielectric layer (D) positioned adjacent either the deposition electrode or the shield electrode. In another embodiment, the pixels comprise one or more backing electrodes (BE) are provided, sized, positioned and oriented to occupy an area which makes a projection onto the particle contact surface in a location not subtended or covered by the deposition electrode or the shield electrode. The one or more backing electrodes (BE) can be sized, positioned and oriented to allow adjust field strengths at the deposition or shield electrodes to increase error correction achieved subtracting the second charge. Alternatively, the chuck can further comprise a dielectric layer positioned between the backing electrode and either of the deposition electrode or the shield electrode. The deposition electrode and the shield electrode can optionally be coplanar.

The invention can comprise a driving circuit for driving and interfacing with the electrodes of the electrostatic sensing chuck, the driving circuit itself comprising: [a] a two wire AC coupled circuit, having a first wire and a second wire; [b] a Wheatstone bridge connected to the first and second wires of the AC coupled circuit, with the Wheatstone bridge having a low pole and a high pole for DC extraction, each of the high pole and low pole available for individual connection to the one of the deposition electrode and the shield electrode; [c] a sensing capacitor connected to either of the first and second wires of the AC coupled circuit; wherein the sum of the detected respective charges in the electric charge distribution and in the similarly created electric charge distribution of opposite polarity is balanced (for example, toward zero) to reduce sensing error or drift. Optionally, the AC coupled circuit comprises a shielded transformer having a primary winding driven by an AC bias source and a secondary winding providing the first and second wire.

The invention also provides a method for depositing or transporting particles using an electrostatic sensing chuck, comprising: [a] applying a first potential to the deposition electrode of the electrostatic sensing chuck to establish an attraction field ($E_a$); [b] applying a second potential to the shield electrode oppositely biased with respect to the first potential; [c] attracting with an electric field established by the first potential and retaining particles to a region of the particle contact surface. Additionally the method can comprise: [d] ceasing particle deposition near the deposition electrode by reducing the first potential after sensing a set amount of accumulated particle charge using the sensing circuit.

Optionally, a third potential is applied to one or more backing electrodes (BE) to increase error correction achieved subtracting the second charge or to aid in balancing the sum of the respective charges in the electric charge distribution and in the similarly created electric charge distribution of opposite polarity.

Additionally, one can: [e] reduce the first potential applied to the deposition electrode; and [f] discharge the powder.

Further, one can: [g] align the electrostatic sensing chuck with a desired location.

The invention also includes a method for reducing unbalanced error charge $Q_{unbalanced}$, the method comprising: [a] applying a first potential to the deposition electrode of the electrostatic sensing chuck to establish an attraction field ($E_a$); [b] applying a second potential to the shield electrode oppositely biased with respect to the first potential; [h] adjusting at least one potential selected from the group of potentials comprising the first potential, the second potential, and a third potential applied to backing electrode (BE), so as to lower an unbalanced voltage drift $V_{drift}$ such that $Q_{unbalanced} = C_{chuck} \cdot V_{drift}$, where $C_{chuck}$ is an effective capacitance for the deposition electrode for the electrostatic sensing chuck. The step [h] can allow, for example, an unbalanced charge $Q_{unbalanced}$ that will tolerated of less than 20 microCoulombs.

Further provided is a method of operating an electrostatic chuck of claim A.1 comprising: providing in the electrostatic chuck at least four pixels comprising particle retention zones with associated deposition electrodes, where at least four of the pixels are the charge-sensing pixels, which charge-sensing pixels are adapted to monitor deposition in each of four representative regions that, in total, define all particle collecting area of the electrostatic chuck; operating the electrostatic chuck to apply particles to the particle retention zones of the electrostatic chuck; removing or reversing particle attracting biases applied the deposition electrodes based on data provided by the charge-sensing pixels.

Additionally provided is a n electrostatic chuck operating in an atmosphere comprising: a first layer formed of a solid dielectric; and a second layer formed on the first layer comprising at least one deposition electrode with a deposition surface facing away from the first layer and, substantially separated from the deposition electrodes by atmosphere, at least one shield electrode with a deposition associated surface facing away from the first layer. Preferably, a hypothetical surface incorporating the deposition surfaces and the deposition-associated surfaces is planar or smoothly curved to smoothly conform with a flexible planar substrate [preferably without stretching the substrate].

DEFINITIONS

The following definitions shall be employed throughout:

"AC" (alternating current) shall denote any electric current that reverses direction, typically periodically; or any applied potential of changing polarity. AC waveforms shall refer to any part or component of such alternating currents, such as a rectified square waveform comprising repeated single polarity pulses (see pulses below), with or without additional DC components.

"Acoustic" can refer to sound waves in air, but more generally may include any alteration of properties of whatever elastic medium is used inside the bead dispenser or bead manipulation theatre. Possible elastic media include dry nitrogen or other gases; water; oil; propylene glycol; refrigerants, such any of the compounds bearing the trademark, Freon® (aliphatic organic compounds containing the elements carbon an fluorene, and others halogens such as chlorine and hydrogen); sand; etc. Properties that may be altered include pressure, particle or molecule displacement, or density. Most commonly, this is achieved using longitudinal compressive waves in the elastic medium, provided by a speaker (see definition below), but it can also occur by using jets or flow of the elastic medium.

"Bias" shall refer to any average direct current (DC) voltage applied to a conductor. This shall include alternating current (AC), AC waveforms, or pulses that when averaged over time reveal a non-zero DC applied overall voltage.

"Conductor" and "electrode" shall include surfaces or sets of surfaces, continuous or non-continuous, that are capable of carrying electric current.

"DC" (direct current) shall denote any quasi-static electric current that flows in one direction only, or any applied potential of single unchanging polarity.

"Dielectric" shall refer to any dielectric material, such as electric insulators in which an electric field can be sustained with a minimum power input; the term is applied generally such that solid metals, if manipulated to meet this definition, for example with a radio frequency applied voltage, can be considered dielectrics. This dielectric material need not be solid (e.g., it can be hollow) and it can be made up of substructures or different constituent dielectric subparts or material types.

"Deposition electrode" shall connote any electrode available to attract, retain, or electrically influence materials things such as powders, beads, objects, or particles at a particle contact surface.

"Floating electrode" shall refer to any electrode electrically isolated from ground or other electrodes and capacitively coupled to one or more bead electrodes for the purpose of attracting beads to one or more particle retention zones.

"Matched" shall refer to selecting any two quantities, such as two separate electrode surface areas, so as to minimize or maximize a third quantity, such as a control signal.

"Near" shall mean immediately proximate, or closest to, the structure in question, such as a charge distribution that forms on a substrate closest to where a projection of the deposition electrode lies.

"Particles" are, for the purposes of this application, aggregates of molecules, typically of at least about 3 nm average diameter, such at least about 500 nm or 800 nm average diameter, and are preferably from about 100 nm to about 5 mm, for example, about 100 nm to about 500 $\mu$m, or 1 $\mu$m to 40 $\mu$m. Particles are, for example, particles of a micronized powder, or polymer structure that can be referred to as "beads." Beads can be coated, have adsorbed molecules, have entrapped molecules, or otherwise carry other substances.

"Particle contact surface" shall include all surfaces of the electrostatic chuck that are accessible to bombardment, contact or exposure to particlea, regardless of whether such access is physically encouraged or discouraged. However, when discussing specifically the particle retention zone (see definition below), the particle retention zone can then be considered separately from the remainder of the particle contact surface, to facilitate description of its placement in the electrostatic manipulating chuck. The particle contact surface may be used to retain or accommodate a substrate as discussed herein.

"Particle retention zones" shall include surfaces of the particle contact surface at which particle attracting fields generated by deposition electrodes attract and favor retention of particles. The particle retention zones can be found at holes, apertures, or recessed areas of the particle contact surface, or elsewhere.

"Polarizable material" shall include materials subject to electric polarization greater than that exhibited by a perfect vacuum. For the purposes of the appended claims, this term shall also include any and all effects due to migration of ions, such as migration to a particle retention zone.

"Pulse" shall refer to quick variation of applied potentials which are otherwise constant, or nearly constant. This variation shall be of finite duration in relation to the charge decay or charge leakage on a substrate. In shape, a pulse or series of pulses can resemble spikes or parts or components of AC waveforms.

"Reducing," such as in the context of reducing applied potentials to bead electrodes to allow bead discharge, or the reduction of a retaining force, shall include reduction and reversal of polarity or sign of the applied potential or force, such as going from +500 V to −500 V, or vice versa.

"Shield electrode" refers to any electrode, adjacent or surrounding the deposition electrode, which serves the purposes of this invention by being biased oppositely with respect to the deposition electrode at some time during deposition sensing. The shield electrode can serve as a focus electrode used at or near the particle contact surface to shield (at least partially) a charged particle from being influenced by attraction fields emanating from a deposition electrode at a particle retention zone, and/or to define and shape (narrow) such a local electric attraction field to encourage desired particle retention.

"Speaker" can refer to any loudspeaker, transducer, machine, or device, such as a piezoelectric device, that is capable of providing acoustic energy, such as through pressure modulation; more generally, it is any device capable of altering the properties of the elastic medium used inside a particle manipulation theatre.

"Substrate" shall refer to any material body that receives or accommodates particles in the course of using electrostatic chuck, It can comprise, for example, a pharmaceutical dosage form into which active ingredients, in the form of powder particles, can be attracted and retained. Substrates can be, for example, clamped or placed onto the particle contact surface of electrostatic chuck, to receive powder, adjacent to or over the projection of each particle retention zone.

"Tend Toward Zero" shall refer to a quantity that is reduced, and shall include any changes that urge a quantity toward zero, either asymptotically, or using any other method, including methods having "overshoot," so long as a running average of the quantity tends to zero.

Regarding electrode orientations, the invention is sometimes defined using the term "adjacent" such as where a deposition electrode is oriented adjacent a shield electrode. In this context, the word adjacent shall mean close to, next to, or merely proximate, as appropriate in the context.

It is also important to note that although the term electrostatic is used here, no limitation is meant or intended in terms of time variations of charge on electrodes and conductors used in the present invention. Electrical currents can and will flow in the course of using the particle manipulating chucks as described, in order to apply and remove electric charge as required. Although the term, electrical may also be used in lieu of the term, "electrostatic," a distinction of convenience is made, so as to make clear that while electrical or electrostatic forces are used to attract beads, the frequency of the applied potentials used is relatively low, that is, not meant to be on the order of radio or microwave frequencies. Potentials refer to electric potentials or applied voltages.

DETAILED DESCRIPTION OF THE INVENTION

Referring to FIGS. 1, 2, 3, and 4, partial cross-sectional views of an electrostatic sensing chuck that can be used according to the present invention are shown, with structures given for one pixel or particle retention zone, and with a substrate (SUBSTRATE) retained. The electrostatic chuck shown is merely illustrative, being given by example only to facilitate description. It is one of many typical electrostatic chucks and alternate chuck configurations that can be used to implement this invention.

The electrostatic chuck shown comprises a deposition electrode DE that can be used to provide a selectively applied particle attracting field. Also shown is a focus or shield electrode SE, separated from the deposition electrode DE by an air gap (or other dielectric, if desired). The shield electrode does not have to be immediately adjacent the deposition electrode. Both deposition electrode DE and shield electrode SE are affixed or contacting a bottom face of a planar dielectric layer D. Dielectric layer D can be applied to either or both deposition electrode DE and shield electrode SE using any number of techniques known in the art, such as laminating; powder deposition; or thin film deposition, such as magnetron sputtering, or electron beam evaporation. Dielectrics that may be used include commonly available materials such as Corning Pyrex 7740 glass (Corning Inc, Corning, N.Y.), ceramics, polyimide resin; a typical thickness is 10–20 mils, or other recognized dielectrics. Dielectric layer D can allow for user safety, isolating an operator from high voltages.

Generally the lower, exposed face of dielectric layer D, as well as the lower exposed faces of electrodes DE and SE as shown form a particle contact surface PCS that is accessible to bombardment, contact or exposure to beads inside a bead dispenser or container, not shown. Because a substrate is interposed at the surface of the chuck for illustration, the particle contact surface PCS is offset to the bottom surface of the substrate, along with a subset of the particle contact surface PCS, where particles are to be attracted, retained, and possibly later discharged, referred here as a particle retention zone PRZ. To attract and retain particles at the particle retention zone PRZ, one or more deposition electrodes DE can be biased attractively for the particle to be manipulated. For example, using a wire, conductor, cable, via, or bus (not shown), a positive potential or bias can be applied to deposition electrode DE, indicated using positive symbolic charges as shown. This attraction bias provides an attraction field $E_a$ as roughly shown and allows for acceleration of net negatively charged particles toward deposition electrode b and particle retention zone PRZ. In a similar manner, a rejection field $E_r$ as shown can result from an opposite bias applied to shield electrode SE, shown here as negative, using negative symbolic charges on shield electrode SE. This discussion illustrates possible electrostatic chuck operation to attract negatively charged particles. To attract positively charged particles, the polarities given here and elsewhere can be switched.

Optional backing electrode BE is shown at the upper planar face of dielectric layer D, shown in areas not covered by subtended projections upward on the page from deposition electrode DE and shield electrode SE. Applying a potential, typically repulsive to particles to be attracted, to backing electrode BE can be used to fine tune edge effects and other electrostatic effects to reduce drift and improve accuracy.

As shown, deposition electrode DE and shield electrode SE are exposed to the particle contact surface PCS or the particle retention zone PRZ, (though the substrate shown shifts the particle contact surface PCS and particle retention zone PRZ downward). However, an additional dielectric material, not shown, can be provided to cover electrodes DE and SE. In that case, the electric field generated by respective potentials applied to deposition electrode DE and shield electrode SE or generated by respective image charge formation can emanate through the additional dielectric layer, with the net electric field in the dielectric diminished by electric polarization, depending on its dielectric constant $\in$, which can be anisotropic. See *Classical Electrodynamics 2nd Ed.*, John David Jackson, ©1975, John Wiley & Sons, New York.

With a positive potential applied to deposition electrode DE, and a negative potential applied to shield electrode SE, polarization in the substrate and dielectric D occurs. This polarization is shown as a half-seeded row of negative and positive surface charges at the planar faces of dielectric layer D. This forms a series of electric dipoles—positive and negative charges separated by a distance—that, shown here for illustration, cancel half the electric field inside dielectric layer b. For illustration purposes, this corresponds to a dielectric constant $\in=2$ (exactly) for dielectric layer D. The polarization occurring in the substrate is only shown at the deposition electrode DE for clarity, again with a half-seeded row of charges. The impedance of electrodes DE and SE as a function of their applied potentials are governed by the laws of capacitors (see ref: *Physics*, 3rd Edition, by David Halliday and Robert Resnick, John Wiley & Sons, NY, ©1978). Once in the vicinity of deposition electrode b, strong electrostatic image forces as described above provide for strong charged particle retention, with the electrostatic image field pointing in the same general direction as $E_a$ shown.

Figure 2:
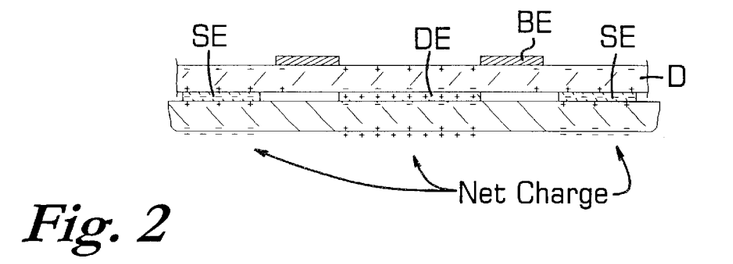
FIG. 2 shows the partial cross-sectional view of the electrostatic chuck of FIG. 1, showing selected net charges available for attraction of powder.

In FIG. 2, the electrostatic chuck is again shown, but with field lines and bottom reference characters removed for clarity. All symbolic charges at the substrate are shown, including resultant full-seeded symbolic surface charges at the substrate surface, demonstrating particle attracting potential (positive) near the deposition electrode DE and particle rejecting potential (negative) near the shield electrode SE. These charges are shown as "Net Charge."

Figure 3:
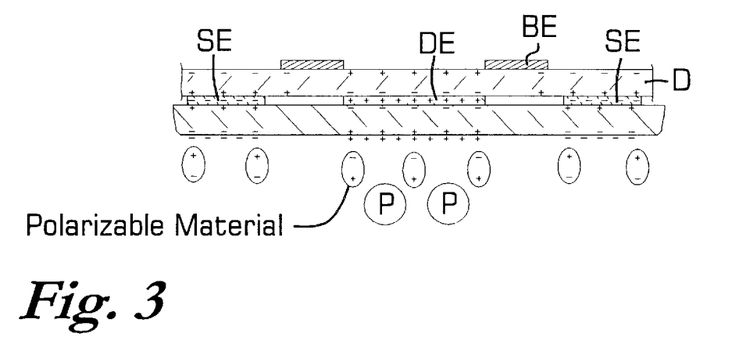
FIG. 3 shows the partial cross-sectional view of the electrostatic chuck of FIG. 2, now showing symbolically the effects of unwanted polarizable materials in the vicinity of the particle contact surface.

Unfortunately, however, the net charge on the substrate surface as shown is not, in practice, unaffected by ambient contaminants and variables at the substrate or particle receiving surface. As shown in FIG. 3, there is the possibility that dust, water vapor, or other polarizable material (shown symbolically, "Polarizable Material" using charge dipoles) will rush to the substrate surface, partially neutralizing the net charge shown in FIG. 2, just as if there were a new additional dielectric positioned at the particle contact surface PCS. Particles attracted to the particle retention zone PRZ, (shown as "P") must compete with this polarizable material, but more importantly, this will affect the deposition and accumulated particle charge relationship.

Electrical deposition monitoring generally depends on the capacitor formed by the deposition electrode DE and the accumulated particle charge, and any intervening dielectrics such as substrates. By sensing charge built up on the effective capacitor formed at the particle retention zone PRZ, a measure of the actual accumulated particle mass can be sensed after trials and calibrations. Generally, within certain limits and conditions, the charge sensed, Q, at the deposition electrode DE is proportional to the actual particle mass M accumulated, so long as the net charge shown in FIG. 2 is primarily attracting particles in a predictable fashion:

$$M = \beta Q \tag{7}$$

where $\beta$ is a constant that can be determined by trials and calibrations for a given chuck geometry, particles, and operating conditions. See, Sun et al., "AC Waveforms Biasing For Bead Manipulating Chucks," U.S. Pat. No. 6,149,774.

Figure 4:
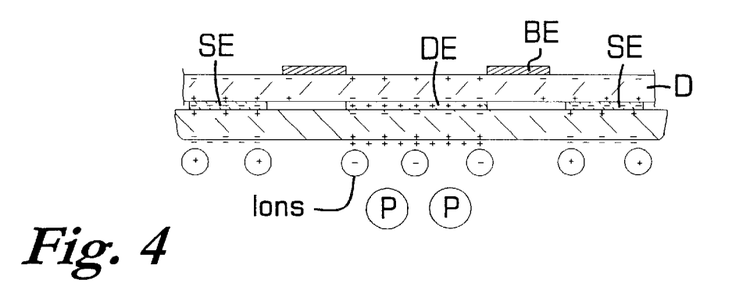
FIG. 4 shows the partial cross-sectional view of FIG. 2, now showing symbolically the effects of unwanted ions in the vicinity of the particle contact surface.

Dust, vapors, contaminants and common gases in the atmosphere can also contribute to a drift or error of the accumulated charge versus actual particle mass relationship. As shown in FIG. 4, particles P also compete with ions from the ambient air or other medium in the particle manipulation theatre, with negative ions attracted to particle retention zone PRZ at the deposition electrode DE, and positive ions attracted to the particle contact surface PCS at shield electrode SE.

The degree to which ions and polarizable materials lower the particle attracting ability of the particle retention zone PRZ is unpredictable, causing drift in the value of $\beta$ which cannot be compensated for beforehand.

Ideally, any discrimination field $E_{discrim}$ (not shown) applied across the particle manipulation theatre, and any polarization field $E_P$ (not shown) established there, are relatively small in the vicinity of the particle retention zone PRZ, and any net or overall electric field acting to retain a particle there, $E_{retain}$, is effectively and approximately equal to the sum of the electrostatic image field $E_{image}$, any attraction fields $E_a$, and any repulsion fields $E_r$:

$$E_{retain} \sim E_{image} + E_a + E_r \tag{8}$$

and the resultant retaining force $F_{retain}$ on any retained particle with charge q is effectively a function of only the electrostatic image force and the attraction and repulsion bias applied to one or more deposition electrode DE:

$$F_{retain} = q \, E_{retain} \sim q \, (E_{image} + E_a + E_r) \tag{9}$$

However, this situation does not apply when ionic and polarizable materials are found at the particle contact surface PCS, and furthermore, the effective ionic and polar charges accumulated at the particle retention zone PRZ make charge sensing a poor predictor of accumulated particle mass as well.

A solution that has been discovered is compatible with the use of electrodes as described, with the shield electrode (SE) oppositely biased with respect to the deposition electrode DE. Now, however, the shield electrode SE is positioned, sized and oriented with respect to the deposition electrode DE such that an electric charge distribution (not shown) created by polarization in a polarizable material near deposition electrode DE would be matched at least in part by a similarly created electric charge distribution (not shown) of opposite polarity near the shield electrode. The sum of the respective opposite charges associated with deposition electrode DE and shield electrode SE in this electric charge distribution tends toward zero.

In FIG. 3, this means, in effect, that the shield electrode SE is positioned, sized and oriented so the that sum of the dipole moments shown symbolically for the polarizable material adjacent shield electrode SE is equal or nearly equal to the sum of the dipole moments shown symbolically for the polarizable material adjacent to deposition electrode DE. In conjunction with a driving circuit described below, this means that the resultant error or background contribution will be zero.

In a similar way, the charge distribution formed by the ionic charges that is formed at the particle contact surface PCS near the shield electrode SE is, by design, equal or nearly equal to, and opposed in polarity with, the charge distribution formed by ionic charges formed near deposition electrode DE. The matching of charge distributions due to polarizable material is chosen because it is easily verifiable through testing using dummy or test dielectrics. In a similar manner to that described, the charge distributions caused by migration of ionic species to electrode DE and SE can be balanced by the driving circuit described below, leaving the accumulated particle charge to be sensed without the associated drift or error.

For planar chucks, the easiest way to achieve this matching of charge distributions is by matching the surface area $A_{DE}$ of deposition electrode DE to the surface area $A_{SE}$ of shield electrode SE:

$$A_{DE} \sim A_{SE} \tag{10}$$

With the deposition electrode DE and shield electrode SE each in a pad and ring configuration, respectively, this means that $$A_{DE} = \pi r^2_{DE} \sim \pi (R^2_{SE\_2} - R^2_{SE\_1}) = A_{SE} \tag{11}$$

where $r_{DE}$ is the effective radius of deposition electrode DE, and $R_{SE\_2}$ and $R_{SE\_1}$ are outer and inner radii of shield electrode SE, respectively. However, nothing in this disclosure prevents using electrodes of any shape, and so equation (10) is more general.

Because of edge effects and geometric considerations, matching of surface areas of deposition electrode DE and shield electrode SE is a guide only, but very useful as a starting point in matching the effective impedance of electrodes DE and SE for attracting the ionic and polar charge distributions. To fine tune the effect, a potential can be applied to backing electrode BE to induce some charge movement toward or away from both deposition electrode DE and shield electrode SE.

Alternatively, deposition electrode DE and shield electrode SE can have different surface areas, compensated by opposite applied voltages having a magnitude that compensates for the area difference. The orientation of deposition electrode DE and shield electrode SE can also be compensating in the same way, reducing the need for actual matching of surface areas.

Whether one adjusts the potential on backing electrode BE, and/or the relative (opposite polarity) potentials on electrodes DE and SE (or even relative electrode surface areas or orientations) the goal is to balance the voltage developed by the ionic and polar charge distributions attracted. Before beginning a deposition process, these potentials may be adjusted to bring the sensor error voltage or drift to zero, preferably with any substrate to be used already in position to minimize error. For a typical electrostatic chuck, this adjustment of potentials allows sensor drift to be kept below 10 pA (picoamp), generally 3–5 pA. This corresponds to less than 6 mV/min drift. The idea is to adjust the potentials in any way desired so as to bring the tolerable unbalanced error charge toward zero. For an unbalanced charge $Q_{unbalanced}$ that will be tolerated at electrodes DE and SE, the tolerable unbalanced voltage drift $V_{drift}$ can be comparable to $$V_{drift} = Q_{unbalanced}/C_{chuck} \quad (12)$$

where $C_{chuck}$ is the effective capacitance of deposition electrode DE of the chuck, which is a function of the electrode geometries and surrounding dielectrics, including the substrate. To illustrate, consider a negatively charged particle with charge/mass ratio Q/M of −40 mC/kg, with a desired deposition of 50 mg on a substrate. This corresponds to a particle charge Q of 2 microCoulombs. For a typical effective chuck capacitance of 10 microFarads, this corresponds to a sensor voltage at electrode DE due to the accumulated particle charge of 200 mV, using the relation V=Q/C for the powder charge. If one selects a tolerated unbalanced (error) charge of 5%, $Q_{unbalanced}$=0.1 microCoulombs, and using equation (12), the tolerable unbalanced voltage drift $V_{drift}$ will be 10 mV. In practice one adjusts voltages on any or all of electrodes DE, SE, and BE to bring the initial detected sensor voltage at deposition electrode DE under 10 mV before commencing particle deposition.

Figure 5:
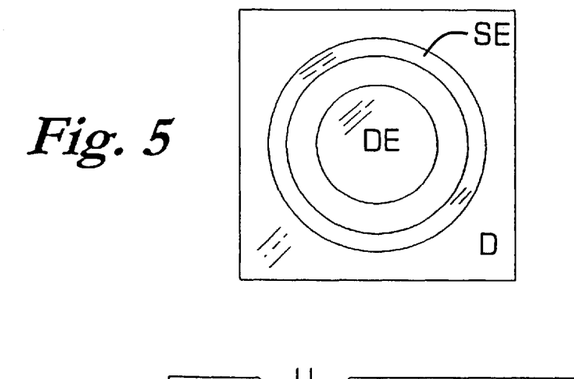
FIG. 5 shows a rough planar surface view of the deposition and shield electrodes having matched surface areas.

FIG. 5 shows a rough planar surface view of the deposition and shield electrodes having matched surface areas. The matched surface areas—in effect, matched projected areas on the particle contact surface PCS—provide that, by principle, deposition electrode DE and shield electrode SE will attract equal but opposite amounts of charge from the offending ionic and polar species, and these amounts will be cancelled by the driving circuit, thereby increasing accuracy. For a deposition electrode DE of radius $r_{DE}$=1 cm, an area-matched candidate for the shield electrode SE is a ring with inside radius $R_{SE\_1}$=1.5 cm, and outside radius $R_{SE\_2}$=1.8 cm.

Figure 6:
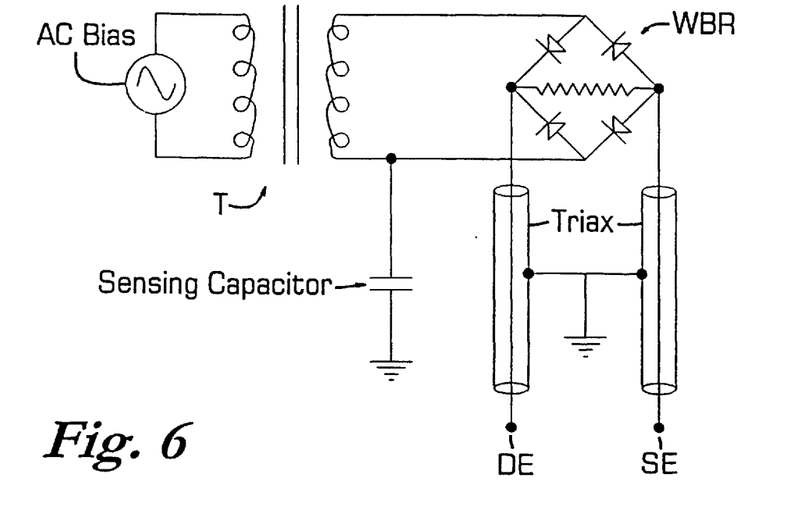
FIG. 6 shows a schematic for a simple, exemplary driving circuit for use with an electrostatic chuck using the instant invention.

FIG. 6 shows an example of a driving circuit that may be used to cancel the drift or error associated with the ions and polarizable material attracted to matched deposition electrode DE and shield electrode SE. The driving circuit generates isolated DC biased points for feeding electrodes DE and SE, while still allowing true accumulated particle charge detection. An AC coupled circuit in the form of a shielded step-up transformer T is used to couple inductively to the charge sensing circuit. Transformer T has its primary winding fed by an AC bias, as shown. The secondary winding of transformer T is fed to the input of a conventional Wheatstone bridge WBR, having high and low DC outputs, fed via triaxial cable (shown, "Triax") to deposition electrode DE and shield electrode SE, with opposing DC polarities chosen to attract the desired polarity of charged particles towards the deposition electrode DE. This configuration allows that currents or charge of opposite polarities on deposition electrode DE and shield electrode SE will not be detected, but an overall "float" or unbalanced charge on deposition electrode DE caused by accumulated charged particles will be measured. This unbalanced charge can be detected by a sensing capacitor (shown, "Sensing Capacitor") coupled to a clean ground. In lieu of the sensing capacitor, any charge measuring device or piece of equipment may be substituted, such as a Model 6514 electrometer manufactured by Keithley of the United States. In this way, unwanted charge distributions caused by ions and polarizable materials are balanced, leaving only the charge accumulated by charged particles at particle retention zone PRZ. See, Horowitz and Hill, *The Art of Electronics,* Cambridge University Press, New York ©1980, for descriptions of suitable electronics including sensing circuits.

The electrodes DE, SE, and BE shown as an example, can each comprise a single conductive pad, conductive strip, a dual strip, conductive mesh or any other configuration that allows for production of requisite fields. Electrodes can be added for other purposes without departing from the scope or spirit of the invention.

For attracting and retaining negatively charged particles, for example, one can establish a positive bias to the deposition electrode DE, and a negative bias to the shield electrode SE. A backing electrode BE can be grounded to help shield the other electrodes and guide particles to their intended destination at any or all particle retention zones PRZ. These biases function in sorting out particles according to polarity and charge/mass ratio, with particles of a certain charge/mass ratio and correct polarity being encouraged to deposit at the particle retention zone(s). If the substrate is relatively insulating, deposition of charged particles will eventually cause the field causing the deposition near deposition electrode DE to be annulled. The deposition thickness that accumulates before this annulment occurs will depend on substrate capacitance, which can be determined easily beforehand by test trials. If the substrate is relatively conducting, continuous particle deposition will occur until insulating (charge retaining) properties of the particles itself cause field annulment. If the particles are slightly conducting, there may be no deposition limit limitation from this effect. Substrate conductivity should be low enough so that significant heating effects do not occur, or to in effect, "short out" electrodes DE and SE, or cause unwanted physical or chemical changes in the deposited particles. Substrates that are slightly conductive will exhibit qualities in between the two just described.

Particles can be charged prior to application to the electrostatic chuck, for example, using plasma or corona charging, induction charging or by the use of tribocharging (rubbing or contact charging) as known in the art. Materials that can be used for tribocharging include polytetrafluoroethylene (TEFLON®), and polymers of chlorotrifluorethylene, chlorinated propylene, vinyl chloride, chlorinated ether, 4-chlorostyrene, 4-chloro-4-methoxy-styrene, sulfone, epichlorhydrin, styrene, ethylene, carbonate, ethylene vinyl acetate, methyl methacrylate, vinyl acetate, vinyl butyral, 2-vinyl pyridine styrene, nylon and ethylene oxide. See, for example, "Triboelectrification of Polymers" in K. C. Frisch and A. Patsis, *Electrical Properties of Polymers* (Technomic Publications, Westport, Conn.). Also see *Handbook of Electrostatic Processes,* Jen-shih Chang, Arnold J. Kelly, and Joseph M. Crowley, eds., Marcel Dekker, Inc., New York, ©1995. For example, polytetrafluoroethylene and polyethylene and other materials that become negatively charged tend to create a positive charge on the bead or particle. Nylon and other materials that become positively charged will tend to create a negative charge on the bead or particle.

Although the particle retention zone PRZ formed on the exposed portion of dielectric layer D is shown as being flat, it can also be recessed, beveled, bowl-shaped, or have any other profile that can facilitate particle attraction, retention, and discharge, particularly if attributes such as particle size selectivity are sought. All that is needed to practice this invention is to select parameters as described above to balance unwanted ionic and polar charge distributions or currents. The technique can be applied to a plurality of particle retention zones PRZ, using any number of deposition and shield electrodes.

In lieu of dielectric layer D, air or the ambient gas or vacuum can be used as a dielectric or insulator. This is useful if the dielectric layer D, such as a Kapton®-based material, retains an unwanted electrostatic charge after a run or operation of the electrostatic chuck. In this case, insulated mechanical standoffs, annular rings, or other fasteners can be used to hold elements in place. For example, standoffs may be used to hold deposition electrode DE in the same plane as, but offset from, shield electrode SE and any other added elements. Also, to make a flat surface for ease of cleaning and geometric compatibility, deposition electrode DE and shield electrode SE may be made coplanar to any degree desired by grinding, polishing, or other techniques. Vacuum can also be used to great advantage in retaining a substrate or other structures.

Figure 1:
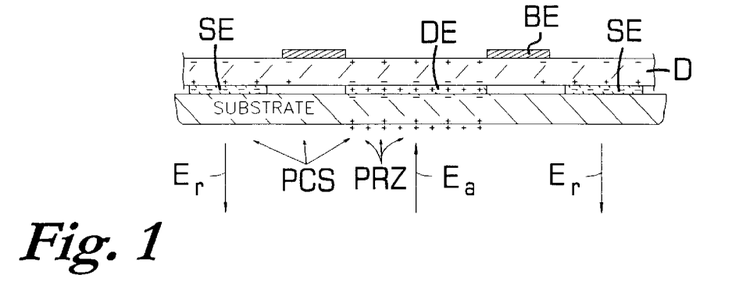
FIG. 1 shows a partial cross-sectional view of an example of electrostatic chuck showing deposition and shield electrodes, and showing typical electric fields and selected charges resulting from applying operating voltages.

Although the electrostatic chucks shown starting with FIG. 1 is given by way of example only, it should be said that fabrication techniques for forming its conductive layers and electrodes can vary considerably, as any known technique satisfying modest electrical and mechanical requirements can be used. Nearly any metal can be used, for example, to form electrodes DE, SE and BE, which can individually comprise thermally or electromagnetically deposited metals such as indium tin oxide, brass, platinum, copper, or gold, of any useful thickness, but preferably about 1000 Angstroms to 10 microns (100,000 Angstroms). The same is true for dielectric layer D—the materials used can be of any type compatible with surrounding electrodes, and having sufficient dielectric strength to withstand anticipated voltages applied, including ceramic materials; silicon dioxide; alumina; polyimide resins and sheets or other suitable polymers; metallic oxides, such as aluminum oxide and titanium oxide; and titanates of calcium and magnesium. Dielectric layer D can range in thickness from ten Angstroms to 1000 microns or more. Various layers can be assembled, if desired, using well known adhesives.

It is possible, for example, to provide a ceramic electrostatic chuck with superior dielectric strength and properties of machinable ceramic, where deposition electrode DE and shield electrode SE and any other desired electrodes are exposed to the substrate or particle contact surface, providing a stronger, more defined electrostatic field. Such a chuck can offer advantages, such as a highly polished uniform surface affording good contact between the substrate and electrodes; a higher electric breakdown (dielectric) strength; lower electrical leakage between electrodes, and between any on board sensors and electrode pads; an easy to clean surface for sanitary or pharmaceutical applications; easy reconfiguration by grinding off or etching an existing pattern of electrodes and re-laying out of new electrodes by fresh deposition of evaporated or sputtered metal; vacuum holding of substrates through small holes in the chuck; and ability to control separately deposition and sensing voltages by arranging electrodes or sets of electrodes in different patterns, to improve uniformity of deposition. Such a ceramic electrostatic chuck can be fabricated as follows.

One takes a ceramic (e.g., quartz, or 99.6% $Al_2O_3$) substrate, polished on both sides, of suitable size and geometry. Assume a first side is that on which particle depositions will be conducted with the finished article. Then 0.5 mm diameter holes are drilled in a suitable geometric pattern. On a second side opposite the first, these holes are countersunk to provide a suitable surface for deposition of evaporated/sputtered metal, rounding off any sharp edges. Then, using a conventional shadow mask, one sputters or evaporates metal on the first and second sides, to a thickness typically ranging from 100 to 500 Å (Angstroms). Such fabrication can be done in a one or two processing steps. Then, optionally, one can coat the first side with diamond-like carbon (DLC), silicon nitride, teflon®, or other suitable material. Such a design is geometrically tight, and allows changes to be made by grinding or etching away the deposited metal layers, while retaining the ceramic as a template or backbone.

Generally, deposition electrode DE and shield electrode SE can comprise any number of separately addressable pixels or elements in two directions x and y, each having separately controlled particle retention zones. Any number of well known means and structures can be used to facilitate addressing as is known in the electrical and electronic arts. See for example, plasma display driver technology.

In the course of using electrostatic chucks with deposition electrodes, a number of conventional operating modes can be used. For particle pickup or retention, an deposition electrode DE, either exposed or unexposed to the particle contact surface, is electrically biased to attract particles, while other conductive surfaces in the device that delivers particles to the electrostatic chuck can be biased oppositely. To achieve the benefits of this invention, for example, shield electrode SE should be biased oppositely. Fine adjustments to balance out unwanted ionic and polarizable material-induced charge can be made by applying a potential to backing electrode BE. For example, local factors including substrate characteristics can introduce a positive drift in sensed "particle" charge, even with only the substrate in contact with the chuck. In this case, for example, one can apply a positive potential to the backing electrode BE to help confine charge on the shield electrode, and eliminate positive drift. Any number of deposition electrodes DE can be used, and they can be individually and separately connected by known means to facilitate individual and selective addressing in two dimensions. Deposition sensing can proceed as described, with unwanted ionic and polar activity at the particle retention zone PRZ balanced out and separated by a driving circuit, such as that here described. AC waveforms can be used, superimposed on the DC voltages described, without departing from the scope of the invention.

When using electrostatic chucks according to the present invention, the temperature is preferably between −50° C. and 200° C., and more preferably between about 22° C. and 60° C. Relative humidity can be 0–100 percent, so long as condensation does not occur; more preferably the relative humidity is about 30 percent.

In this way, electrostatic chucks can balance out and in effect, cancel, unwanted charge distributions to allow measurement of particle charge accumulation to proceed with higher resolution, reproducibility, and accuracy. Obviously, many modifications and variations of the present invention are possible in light of the above teaching. It is therefore to be understood, that within the scope of the appended claims, the invention can be practiced otherwise than as specifically described or suggested here.

The charge-sensing electrostatic chuck of the invention can comprise numerous pixels, each comprising a particle retention zone. Such an electrostatic chuck can further comprise pixels with the charge sensing circuitry described above, where these pixels, if they are not all or most of the pixels, are distributed to monitor deposition in at least 4, 8, 16 or 32 representative regions that, in total, define all of the particle collecting area of the electrostatic chuck. "Representative" regions in this context shall mean regions that are reasonably adapted to monitor all to the particle collecting area of the electrostatic chuck. The electrostatic chuck is operated with the deposition or deposition rates at the pixels monitored through these charge sensing pixels, with the particle-attracting biases at pixels determined to have been coated to the pre-determined endpoint removed or reversed. It should be noted that software operating a controller can interpolate the data from a representative set of pixels to determine the deposition or deposition rates at the remainder of the pixels, using interpolations or historical operating correlations, or both.

Figure 7:
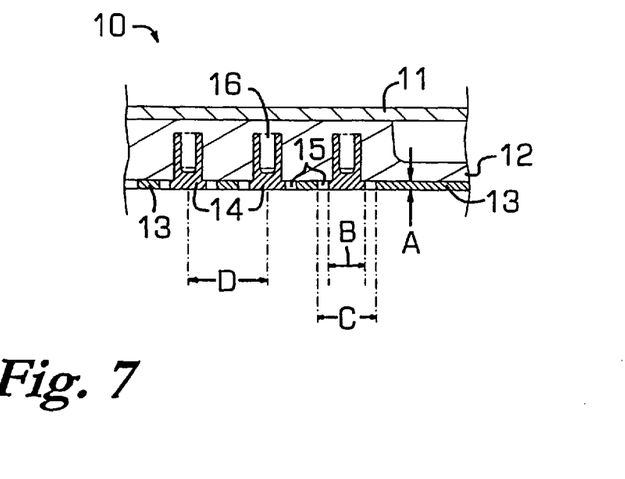
FIG. 7 illustrates a preferred form of electrostatic chuck.

FIG. 7 shows a cross-section of a coplanar chuck 10 where deposition electrodes 14 are separated from shield electrodes 13 by dielectric (preferably atmosphere) 15, with these features seated in base material 12. The deposition electrodes 14 are preferably formed of series 300 stainless steel. Deposition electrodes 14 contain a pin receptacle 16 for connection to circuit board 11. Base material 12 is made of a dielectric such as Noryl® polymer (GE Plastics, Pittsfield, Mass.). Noryl engineered plastics are modified polyphenylene oxide, or polyphenylene oxide and polyphenylene ether, resins. The modification of these resins involves blending with a second polymer such as polystyrene or polystyrene/butadiene. By varying the blend ratio and other additives, a variety of grades are produced. Unmodified, these polymers are characterized by regular closely spaced ring structures (phenyl groups) in the main molecular chain. This feature along with strong intermolecular attraction causes extreme stiffness and lack of mobility. The shield electrodes 13 can be made from a conductive material (such as 300 series stainless steel) adhered to the base material 12, for example by an adhesive or a double-sided, rubber-based adhesive tape. The annular gaps that are the preferred embodiment of dielectric 15 can be made by drilling a series of holes in the conductor layer that will form the shield electrodes 13. The deposition electrodes 14 can be, for example, pressed or glued into the base material. The assembly is preferably ground to create a flat, coplanar surface, for example within a tolerance of 0.0002 inches. Where dielectric 15 is atmosphere (that atmosphere in which the electrostatic chuck operates), preferably the portion of the dielectric separation of the electrodes comprising atmosphere is sufficient so that in use the upper plane of the electrostatic chuck aligned with dielectric 15 discharges completely between depositions. Such an amount of dielectric separation is "substantial" separation.

Such an electrostatic chuck can be simply modified with the techniques described to incorporate electrically isolated shield electrodes that can be separately connected to control electronics to provide the sensing circuits described above. Dimension A can be, for example, 0.01 inch; Dimension B can be, for example, 0.157 inch; Dimension C can be, for example, 0.236 inch; Dimension D, the pitch between pixels, can be, for example, 0.3543 inch. The electrostatic chuck can be operated, for example, with a voltage of ±700 or ±1,400 V applied to the deposition electrodes.

All publications and references, including but not limited to patents and patent applications, cited in this specification are herein incorporated by reference in their entirety as if each individual publication or reference were specifically and individually indicated to be incorporated by reference herein as being fully set forth. Any patent application to which this application claims priority is also incorporated by reference herein in its entirety in the manner described above for publications and references.

While this invention has been described with an emphasis upon preferred embodiments, it will be obvious to those of ordinary skill in the art that variations in the preferred devices and methods may be used and that it is intended that the invention may be practiced otherwise than as specifically described herein. Accordingly, this invention includes all modifications encompassed within the spirit and scope of the invention as defined by the claims that follow.

What is claimed:

1. An electrostatic sensing chuck for attracting particles to a portion of a particle contact surface near a deposition electrode, the electrostatic sensing chuck comprising a pixel comprising:

a deposition electrode for selectively establishing an attraction field at the particle contact surface;

a shield electrode oppositely biased with respect to the deposition electrode;

a charge sensing circuit to measure charge accumulated on each of the deposition electrode and the shield electrode, wherein the charge sensing circuit subtracts a second charge it senses at the shield electrode from a first charge it senses at the deposition electrode, thereby determining accumulated charge at the deposition electrode balanced by accumulated charge at the shield electrode.

2. An electrostatic sensing chuck for attracting particles to a portion of a particle contact surface near a deposition electrode, the electrostatic sensing chuck comprising a pixel comprising:

a deposition electrode for selectively establishing an attraction field at the particle contact surface;

a shield electrode oppositely biased with respect to the deposition electrode;

a charge sensing circuit to measure charge accumulated on each of the deposition electrode and the shield electrode, wherein the charge sensing circuit subtracts a second charge it senses at the shield electrode from a first charge it senses at the deposition electrode, thereby determining accumulated charge at the deposition electrode balanced by accumulated charge at the shield electrode, wherein the shield electrode is sized and oriented with respect to the deposition electrode as needed to achieve cancellation of drift in output from the sensing circuit, and dielectric insulating the shield and deposition electrode sufficiently to reduce leakage voltages therefrom to achieve cancellation of drift in output from the sensing circuit.

3. The electrostatic chuck of claim 2, wherein an effective surface area of the shield electrode is matched to an effective surface area of the deposition electrode.

4. The electrostatic chuck of claim 2, wherein the pixel further comprises a backing electrode sized, positioned and oriented to occupy an area which makes a projection onto the particle contact surface in a location not subtended or covered by the deposition electrode or the shield electrode.

5. The electrostatic chuck of claim 2, wherein the pixel further comprises one or more backing electrodes sized, positioned and oriented to adjust field strengths at the deposition or shield electrodes to increase error correction achieved by subtracting charge accumulations from the shield electrode.

6. The electrostatic chuck of claim 2, wherein the deposition electrode and the shield electrode are coplanar.

7. A method of operating an electrostatic chuck of claim 2 comprising:

provinding in the electrostatic chuck at least four pixels comprising particle retention zones with associated deposition electrodes, where at least four of the pixels are the charge-sensing pixels, which charge-sensing pixels are adapted to monitor deposition in each of four representative regions that, in total, define all particle collecting area of the electrostatic chuck;

operating the electrostatic chuck to apply particles to the particle retention zones of the electrostatic chuck;

removing or reversing particle attracting biases applied to the deposition electrodes based on data provided by the charge-sensing pixels.

8. The electrostatic chuck of claim wherein the charge measuring device is a sensing capacitor.

9. A charge sensing circuit is a driving circuit for driving and interfacing with a deposition electrode and a shield electrode of an electrostatic sensing chuck, the driving circuit comprising:

[a] a two wire AC coupled circuit, having a first wire and a second wire;

[b] a Wheatstone bridge connected to the first and second wires of the AC coupled circuit, the Wheatstone bridge having a low pole and a high pole for DC extraction, wherein the high pole is connected to one of the deposition electrode and the shield electrode and low pole is connected to the other of the deposition electrode and the shield electrode; and

[c] a charge measuring device connected to either of the first and second wires of the AC coupled circuit; wherein the sum of the detected respective charges in the electric charge distribution and in the similarly created electric charge distribution of opposite polarity are balanced to reduce sensing error.

10. The electrostatic chuck of claim 9, wherein the AC coupled circuit comprises a shielded transformer having a primary winding driven by an AC bias source and a secondary winding providing the first and second wire.

11. The electrostatic chuck of claim 2, wherein the electrostatic chuck comprises at least four pixels comprising particle retention zones with associated deposition electrodes, where at least four of the pixels are the charge-sensing pixels, which charge-sensing pixels are adapted to monitor deposition in each of four representative regions that, in total, define all particle collecting area of the electrostatic chuck, and further comprising a controller for operating the electrostatic chuck to apply particles to the particle retention zones, the controller programmed for:

removing or reversing particle attracting biases applied to the deposition electrodes based on data provided by the charge-sensing pixels.

12. The electrostatic chuck of claim 11, wherein the charge measuring device is a sensing capacitor.

13. The electrostatic chuck of claim 1, wherein the pixel further comprises a backing electrode sized, positioned and oriented to occupy an area which makes a projection onto the particle contact surface in a location not subtended or covered by the deposition electrode or the shield electrode.

14. The electrostatic chuck of claim 1, wherein the pixel further comprises one or more backing electrodes sized, positioned and oriented to adjust field strengths at the deposition or shield electrodes to increase error correction achieved by subtracting charge accumulations from the shield electrode.

15. The electrostatic chuck of claim 1, wherein the deposition electrode and the shield electrode are coplanar.

16. The electrostatic chuck of claim 1, wherein the charge sensing circuit is a driving circuit for driving and interfacing with the electrodes of the electrostatic sensing chuck, the driving circuit comprising:

[a] a two wire AC coupled circuit, having a first wire and a second wire;

[b] a Wheatstone bridge connected to the first and second wires of the AC coupled circuit, the Wheatstone bridge having a low pole and a high pole for DC extraction, wherein the high pole is connected to one of the deposition electrode and the shield electrode and low pole is connected to the other of the deposition electrode and the shield electrode; and

[c] a charge measuring device connected to either of the first and second wires of the AC coupled circuit; wherein the sum of the detected respective charges in the electric charge distribution and in the similarly created electric charge distribution of opposite polarity are balanced to reduce sensing error.

17. The electrostatic chuck of claim 16, wherein the AC coupled circuit comprises a shielded transformer having a primary winding driven by an AC bias source and a secondary winding providing the first and second wire.

18. The electrostatic chuck of claim 1, wherein the electrostatic chuck comprises at least four pixels comprising particle retention zones with associated deposition electrodes, where at least four of the pixels are the charge-sensing pixels, which charge-sensing pixels are adapted to monitor deposition in each of four representative regions that, in total, define all particle collecting area of the electrostatic chuck, and further comprising a controller for operating the electrostatic chuck to apply particles to the particle retention zones, the controller programmed for:

removing or reversing particle attracting biases applied to the deposition electrodes based on data provided by the charge-sensing pixels.

19. The electrostatic chuck of claim 18, wherein the charge measuring device is a sensing capacitor.

20. A method of operating an electrostatic chuck of claim 2 comprising:

providing in the electrostatic chuck at least four pixels comprising particle retention zones with associated deposition electrodes, where at least four of the pixels are the charge-sensing pixels, which charge-sensing pixels are adapted to monitor deposition in each of four representative regions that, in total, define all particle collecting area of the electrostatic chuck;

operating the electrostatic chuck to apply particles to the particle retention zones of the electrostatic chuck;

removing or reversing particle attracting biases applied the deposition electrodes based on data provided by the charge-sensing pixels.

21. The electrostatic chuck of claim 20, the charge measuring device is a sensing capacitor.

* * * * *